United States Patent
Hayashi et al.

(10) Patent No.: US 9,515,249 B2
(45) Date of Patent: *Dec. 6, 2016

(54) PIEZOELECTRIC MATERIAL

(75) Inventors: Jumpei Hayashi, Yokohama (JP); Tatsuo Furuta, Machida (JP); Yasushi Shimizu, Fujisawa (JP); Takanori Matsuda, Chofu (JP); Hiroshi Saito, Kawasaki (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 129 days.

This patent is subject to a terminal disclaimer.

(21) Appl. No.: 14/130,670

(22) PCT Filed: Jun. 26, 2012

(86) PCT No.: PCT/JP2012/066838
§ 371 (c)(1),
(2), (4) Date: Jan. 2, 2014

(87) PCT Pub. No.: WO2013/005702
PCT Pub. Date: Jan. 10, 2013

(65) Prior Publication Data
US 2014/0131611 A1 May 15, 2014

(30) Foreign Application Priority Data

Jul. 5, 2011 (JP) .................. 2011-149359

(51) Int. Cl.
*H01L 41/187* (2006.01)
*C04B 35/468* (2006.01)
*C04B 35/49* (2006.01)

(52) U.S. Cl.
CPC ....... *H01L 41/1871* (2013.01); *C04B 35/4682* (2013.01); *C04B 35/49* (2013.01); *C04B 2235/3208* (2013.01); *C04B 2235/3215* (2013.01); *C04B 2235/3225* (2013.01); *C04B 2235/3236* (2013.01); *C04B 2235/3239* (2013.01); *C04B 2235/3244* (2013.01); *C04B 2235/3248* (2013.01); *C04B 2235/3262* (2013.01); *C04B 2235/449* (2013.01); *C04B 2235/5445* (2013.01); *C04B 2235/72* (2013.01); *C04B 2235/77* (2013.01); *C04B 2235/786* (2013.01); *C04B 2235/79* (2013.01)

(58) Field of Classification Search
CPC .......... H01L 41/1871; C09K 35/4682; C09K 35/49
See application file for complete search history.

(56) References Cited

U.S. PATENT DOCUMENTS

| 4,755,493 | A | 7/1988 | Takeuchi et al. |
| 2010/0029464 | A1 | 2/2010 | Shibasaki et al. |
| 2014/0117811 | A1 | 5/2014 | Hayashi et al. |
| 2014/0145106 | A1 | 5/2014 | Hayashi et al. |

FOREIGN PATENT DOCUMENTS

| CN | 100371252 C | | 2/2008 |
| CN | 101238080 A | | 8/2008 |
| CN | 101260000 | * | 9/2008 |
| CN | 101935212 A | | 1/2011 |
| EP | 2328193 | * | 6/2011 |
| EP | 2328193 A2 | | 6/2011 |
| JP | 2000-082796 A | | 3/2000 |
| JP | 2004238251 A | | 8/2004 |
| JP | 2009-215111 A | | 9/2009 |
| JP | 2010-120835 A | | 6/2010 |
| JP | 2011032111 A | | 2/2011 |
| RU | 2305669 C1 | | 9/2007 |
| WO | WO 2012/070667 | * | 5/2012 |
| WO | WO 2012/093646 | * | 7/2012 |

OTHER PUBLICATIONS

Dezhen Xue et al.; "Elastic, Piezoecletric, Dielectric Properties of Ba(Z40.2Ti0.8_O3-50 (Ba0.7Ca0.3)TiO3 Pb-Free Ceramic At the Morphotropic Phase Boundary;" Journal of Applied Physics, vol. 109, 2011, pp. from 054110-1 to 054110-6.

Daisuke Tanaka et al.; "High Power Characteristics of (Ca,Ba)TiO3 Piezoelectric Ceramics With High Mechanical Quality Factor;" Japanese Journal of Applied Physics; vol. 49, 2010, pp. from 09MD03-1 to 09MD03-4.

Li, et al., "Piezoelectric and Dielectric Properties of (Ba1-xCax)(Ti0.95Zr0.05)O3 Lead-Free Ceramics", J. Am. Ceram. Soc. vol. 93, No. 10, pp. 2942-2944, 2010.

* cited by examiner

*Primary Examiner* — Carol M Koslow
(74) *Attorney, Agent, or Firm* — Canon U.S.A., Inc., IP Division

(57) ABSTRACT

A lead-free piezoelectric material that has stable, excellent piezoelectric constant and mechanical quality factor in a wide operating temperature range is provided. A piezoelectric material include a perovskite-type metal oxide represented by $(Ba_{1-x}Ca_x)_a(Ti_{1-y}Zr_y)O_3$ (where $1.00 \leq a \leq 1.01$, $0.155 \leq x \leq 0.300$, $0.041 \leq y \leq 0.069$) as a main component, and manganese incorporated in the perovskite-type metal oxide. The manganese content relative to 100 parts by weight of the perovskite-type metal oxide is 0.12 parts by weight or more and 0.40 parts by weight or less on a metal basis.

3 Claims, 1 Drawing Sheet

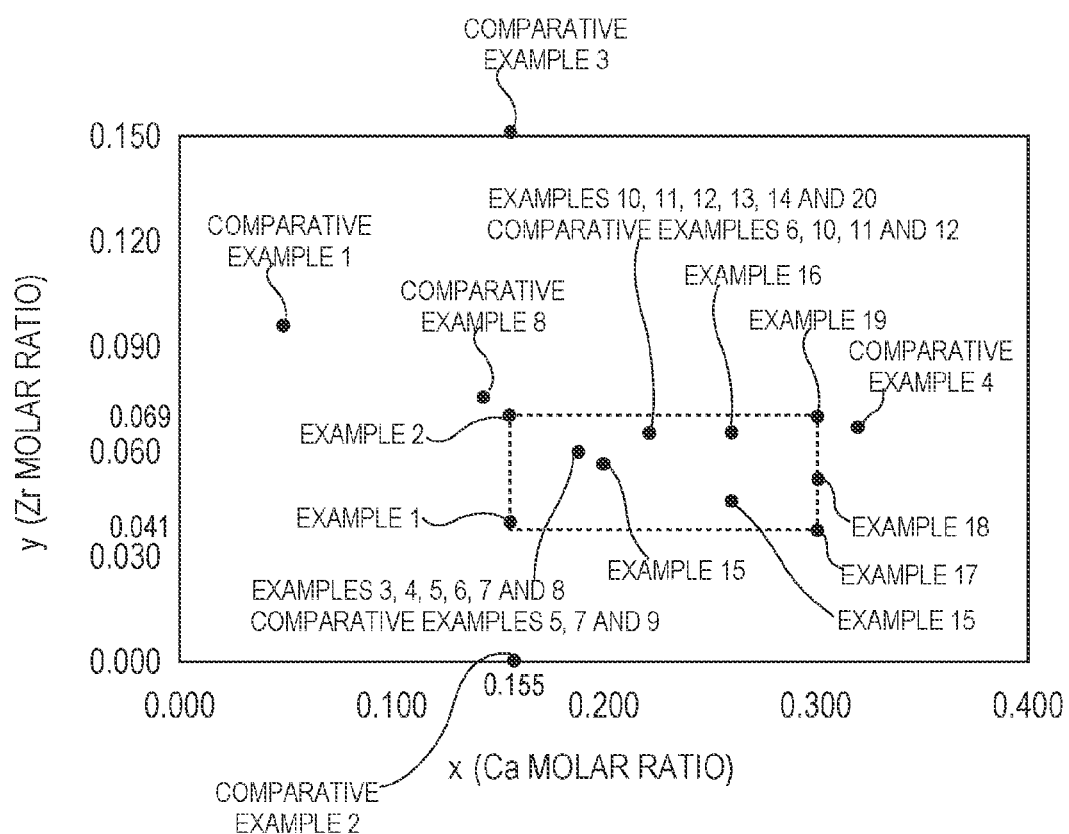

PIEZOELECTRIC MATERIAL

TECHNICAL FIELD

The present invention generally relates to piezoelectric materials and, in particular, to a lead-free piezoelectric material.

BACKGROUND ART $ABO_3$ perovskite-type metal oxides such as lead zirconate titanate (referred to as "PZT" hereinafter) are typically used as piezoelectric materials. Since PZT contains lead as the A site element, a concern has been raised over PZT's impact on the environment. Thus, piezoelectric materials that use lead-free perovskite-type metal oxides are highly desirable.

An example of a lead-free piezoelectric material that contains a perovskite-type metal oxide is barium titanate. Studies on and development of barium-titanate-based materials have been conducted to improve properties of barium titanate. PTL 1 and NPL 1 each disclose a material having a piezoelectric property improved by substituting some of A sites of barium titanate with Ca and some of B sites with Zr. However, such a material has a low Curie temperature of 80° C. or less and undergoes depolarization in a severe environment such as car compartments under summer sun, resulting in degradation of the piezoelectric property. Moreover, since the mechanical quality factor is small, the material is likely to undergo depolarization when AC voltage is applied.

PTL 2 and NPL 2 each disclose a material prepared by substituting some of A sites of barium titanate with Ca and adding Mn, Fe, or Cu. Such a material has a mechanical quality factor superior to that of barium titanate but exhibits a low piezoelectric property.

CITATION LIST

Patent Literature

PTL 1 Japanese Patent Laid-Open No. 2009-215111
PTL 2 Japanese Patent Laid-Open No. 2010-120835

Non Patent Literature

NPL 1 "Journal of Applied Physics" vol. 109 2011, from 054110-1 to 054110-6
NPL 2 "Japanese Journal of Applied Physics" vol. 49 2010, from 09MD03-1 to 09MD03-4

SUMMARY OF INVENTION

Technical Problem

The present invention provides a lead-free piezoelectric material having a wide operating temperature range and stable, excellent piezoelectric constant and mechanical quality factor.

Solution to Problem

An aspect of the invention provides a piezoelectric material that includes a perovskite-type metal oxide represented by general formula (1) as a main component, and manganese incorporated in the perovskite-type metal oxide $(Ba_{1-x}Ca_x)_a(Ti_{1-y}Zr_y)O_3$ (where $1.00 \leq a \leq 1.01$, $0.155 \leq x \leq 0.300$, $0.041 \leq y \leq 0.069$)     (1)

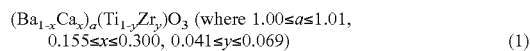

The manganese content relative to 100 parts by weight of the perovskite-type metal oxide is 0.12 parts by weight or more and 0.40 parts by weight or less on a metal basis.

Advantageous Effects of Invention

The present invention provides a lead-free piezoelectric material having a wide operating temperature range and stable, excellent piezoelectric constant and mechanical quality factor.

BRIEF DESCRIPTION OF DRAWINGS

FIG. 1 is a graph showing the relationship between x and y of piezoelectric materials of Examples 1 to 21 and Comparative Examples 1 to 14.

DESCRIPTION OF EMBODIMENT

An embodiment of the invention will now be described.

A piezoelectric material according to an embodiment contains a perovskite-type metal oxide represented by general formula (1) below as a main component and manganese incorporated in the perovskite-type metal oxide:

$(Ba_{1-x}Ca_x)_a(Ti_{1-y}Zr_y)O_3$ (where $1.00 \leq a \leq 1.01$, $0.155 \leq x \leq 0.300$, $0.041 \leq y \leq 0.069$)     (1)

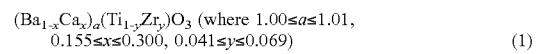

The manganese content relative to 100 parts by weight of the perovskite-type metal oxide is 0.12 parts by weight or more and 0.40 parts by weight or less on a metal basis.

In this description, a perovskite-type metal oxide refers to a metal oxide having a perovskite-type structure which is ideally a cubic crystal structure as described in Iwanami Rikagaku Jiten, 5th edition (published Feb. 20, 1998 by Iwanami Shoten Publishers). A metal oxide having a perovskite-type structure is usually expressed by a chemical formula, $ABO_3$. Element A and element B in a perovskite-type metal oxide take form of ions and occupy particular positions in a unit cell called A sites and B sites, respectively. For example, in a unit cell of a cubic crystal system, element A occupies vertexes of the cube and element B occupies the body-centered position of the cube. Element O is oxygen in the form of an anion and occupies face-centered positions of the cube.

In the metal oxide represented by general formula (1) above, barium (Ba) and calcium (Ca) are metal elements that occupy A sites and titanium (Ti) and zirconium (Zr) are metal elements that occupy B sites. Note that some of Ba and Ca atoms may occupy B sites and/or some of Ti and Zr atoms may occupy A sites.

In general formula (1), the molar ratio of the B-site element to O is 1:3. A metal oxide having a B-site element/O ratio slightly deviated therefrom, e.g., 1.00:2.94 to 1.00:3.06, is still included in the scope of the present invention as long as the metal oxide has a perovskite-type structure as a main phase.

Structural analysis through X-ray diffraction or electron beam diffraction can be used to determine whether a metal oxide has a perovskite-type structure, for example.

The piezoelectric material may take any form, for example, a ceramic, powder, single crystal, film, slurry, or the like but is preferably a ceramic. In this description, a "ceramic" refers to an aggregate (also referred to as bulk) of crystal grains basically composed of a metal oxide and consolidated by heat treatment, and is a polycrystal. A "ceramic" may also refer to a ceramic that has been processed after sintering.

In general formula (1) above, a represents the ratio of the total molar amount of Ba and Ca in A sites to the total molar amount of Ti and Zr in B sites and is in a range of $1.00 \leq a \leq 1.01$. When a is smaller than 1.00, abnormal grain growth readily occurs and the mechanical strength of the material is decreased. When a is greater than 1.01, the temperature needed for grain growth becomes excessively high and sintering cannot be achieved in a common firing furnace. Here, "sintering cannot be achieved" refers to a state in which the density is not sufficiently increased or a large number of pores and defects are present in the piezoelectric material. More preferably, $1.004 \leq a \leq 1.009$.

In general formula (1), x represents the molar ratio of Ca in A sites and is in a range of $0.155 \leq x \leq 0.300$. When x is less than 0.155, a crystal structure phase transition occurs at operating temperatures, thereby adversely affecting the durability. In contrast, when x is larger than 0.300, the piezoelectric property becomes insufficient. More preferably, $0.155 \leq x \leq 0.240$ and most preferably $0.160 \leq x \leq 0.240$.

In general formula (1), y indicating the molar ratio of Zr in B sites is in a range of $0.041 \leq y \leq 0.069$. When y is smaller than 0.041, the piezoelectric property becomes insufficient. In contrast, when y is larger than 0.069, the Curie temperature ($T_C$) becomes as low as less than 100° C. and the piezoelectric property will be lost at a high temperature. Preferably, $0.045 \leq y \leq 0.069$.

In this description, a Curie temperature refers to a temperature at which ferroelectricity is lost. Examples of the method for detecting the temperature include a method of directly measuring the temperature at which ferroelectricity is lost by varying the measurement temperature and a method of measuring the dielectric constant using minute AC fields while varying the measurement temperature and determining the temperature at which the dielectric constant is maximal.

The method for determining the composition of the piezoelectric material is not particularly limited. Examples of the method include X-ray fluorescence analysis, inductively coupled plasma (ICP) atomic emission spectroscopy, and atomic absorption spectrometry. The weight ratios and compositional ratios of the elements contained in the piezoelectric material can be determined by any of these methods.

The Mn content in the piezoelectric material is 0.12 parts by weight or more and 0.40 parts by weight or less on a metal basis relative to 100 parts by weight of the metal oxide. At an Mn content in this range, the insulating property and the mechanical quality factor are improved. Here, the mechanical quality factor refers to a factor that indicates an elastic loss caused by oscillation when the piezoelectric material is used in an oscillator. The magnitude of the mechanical quality factor is observed as a sharpness of a resonance curve in impedance measurement. In other words, the mechanical quality factor is a factor that indicates the sharpness of the resonance of an oscillator. Presumably, the insulating property and the mechanical quality factor are improved by introduction of defect dipoles due to Mn having a valence different from that of Ti and Zr and generation of internal electric fields resulting therefrom. When an internal electric field is present, a piezoelectric element formed by using the piezoelectric material and operated by applying voltage exhibits long-term reliability.

The term "on a metal basis" with reference to the Mn content refers to a value determined by first determining the oxide-based amounts of elements constituting the metal oxide represented by general formula (1) based on the Ba, Ca, Ti, Zr, and Mn contents measured by XRF, ICP atomic emission spectroscopy, atomic absorption spectroscopy, or the like and then calculating the ratio of the weight of Mn relative to 100 parts by weight of the total amount of the elements constituting the metal oxide on a weight basis.

When the Mn content is less than 0.12 parts by weight, the mechanical quality factor is decreased to less than 400. At a low mechanical quality factor, a resonance device including a piezoelectric element prepared by attaching a pair of electrodes to the piezoelectric material exhibits increased power consumption when operated. The mechanical quality factor is 400 or more and more preferably 800 or more. The power consumption does not significantly increase during actual operation as long as the mechanical quality factor is within this range. In contrast, when the Mn content is greater than 0.40 parts by weight, the piezoelectric property may not be sufficient and crystals having a hexagonal structure not contributing to the piezoelectric property may emerge. The Mn content is preferably 0.20 parts by weight or more and 0.40 parts by weight or less.

Manganese is not limited to metallic Mn and may take any form as long as manganese is contained as a component in the piezoelectric material. For example, manganese may be dissolved in B sites or may be included in grain boundaries. Manganese may take the form of a metal, ion, oxide, metal salt, or complex in the piezoelectric material. Preferably, manganese is dissolved in B sites from the viewpoints of insulating property and sinterability. When manganese is dissolved in B sites, a preferable range of the molar ratio A/B is $0.993 \leq A/B \leq 0.998$, where A is the molar amount of Ba and Ca in A sites and B is the molar amount of Ti, Zr, and Mn in B sites. A piezoelectric material having A/B within this range exhibits particularly favorable piezoelectric constants and mechanical quality factors. Thus, a device having high durability can be fabricated by using such a piezoelectric material.

The piezoelectric material may contain components (hereinafter referred to as auxiliary components) other than the compound represented by general formula (1) and Mn as long as the properties are not changed. The total content of the auxiliary components may be 1.2 parts by weight or less relative to 100 parts by weight of the metal oxide represented by general formula (1). When the auxiliary component content exceeds 1.2 parts by weight, the piezoelectric property and the insulating property of the piezoelectric material may be degraded. The content of the metal elements other than Ba, Ca, Ti, Zr, and Mn among the auxiliary components is preferably 1.0 parts by weight or less on an oxide basis or 0.9 parts by weight or less on a metal basis relative to the piezoelectric material. In this description, "metal elements" include semimetal elements such as Si, Ge, and Sb. When the content of the metal elements other than Ba, Ca, Ti, Zr, and Mn among the auxiliary components exceeds 1.0 parts by weight on an oxide basis or 0.9 parts by weight on a metal basis relative to the piezoelectric material, the piezoelectric property and the insulating property of the piezoelectric material may be significantly degraded. The total content of Li, Na, Mg, and Al among the auxiliary components may be 0.5 parts by weight or less on a metal basis relative to the piezoelectric material. When the total content of Li, Na, Mg, and Al among the auxiliary components exceeds 0.5 parts by weight on a metal basis relative to the piezoelectric material, insufficient sintering may occur. The total of Y and V among the auxiliary components may be 0.2 parts by weight or less on a metal basis relative to the piezoelectric material. When the total content of Y and V exceeds 0.2 parts by weight on a metal basis relative to the piezoelectric material, the polarization treatment may become difficult.

Examples of the auxiliary components include sintering aids such as Si and Cu. Commercially available Ba and Ca raw materials contain Sr as an unavoidable impurity and thus the piezoelectric material may contain an impurity amount of Sr. Similarly, a commercially available Ti raw material contains Nb as an unavoidable impurity and a commercially available Zr raw material contains Hf as an unavoidable impurity. Thus, the piezoelectric material may contain impurity amounts of Nb and Hf.

The method for measuring the weights of the auxiliary components is not particularly limited. Examples of the method include X-ray fluorescence analysis, ICP atomic emission spectroscopy, and atomic absorption spectrometry.

The Ca/Zr (x/y) molar ratio b of the piezoelectric material may be in a range of 2.65≤b≤5.00. When b is less than 2.65, Mn does not sufficiently dissolve and the mechanical quality factor may decrease. In contrast, when b is greater than 5.00, the ratios of the c axis and the a axis of a unit cell increase and the piezoelectric property may decrease. More preferably, 2.71≤b≤5.00.

The piezoelectric material preferably has no crystal structure phase transition point in a range of −25° C. to 100° C.

Generally, barium titanate has an orthorhombic-to-tetragonal transition temperature (hereinafter, $T_{o \to t}$) of about 17° C. and a tetragonal-to-orthorhombic transition temperature (hereinafter, $T_{t \to o}$) of about 5° C. When the piezoelectric material transitions back and forth between these crystal structure phase transition points, the volume and the polarization axis directions of the unit cell will change, possibly resulting in gradual depolarization and deterioration of the piezoelectric property. Accordingly, barium titanate has been difficult to use in a wide temperature range.

However, the piezoelectric material of this embodiment has $T_{o \to t}$ lower than −25° C. and thus does not face the difficulty described above. Moreover, since the Curie temperature is 100° C. or more, the piezoelectricity will not be lost and will be retained even in a severe environment, such as car compartments under summer sun, as hot as 80° C. Because the tetragonal structure is maintained in a temperature range of −25° C. to 100° C., the mechanical quality factor can be maintained at a high level and use of the orthorhombic region in which the mechanical quality factor is small can be avoided. Thus, stable, excellent piezoelectric constants and mechanical quality factors can be offered in a wide operating temperature range.

The piezoelectric material of this embodiment may be constituted by crystal grains having an average circular equivalent diameter of 1 μm or more and 10 μm or less. When the average circular equivalent diameter is within this range, the piezoelectric material can exhibit good piezoelectric property and mechanical strength. When the average circular equivalent diameter is less than 1 μm, the piezoelectric property may become insufficient. When the average circular equivalent diameter is more than 10 μm, the mechanical strength may decrease. A more preferable range is 3 μm or more and 8 μm or less.

In this description, a "circular equivalent diameter" refers to what is generally known as a "projected area diameter" in microscopy and indicates the diameter of a circle having the same area as the projected area of a crystal grain. In this invention, the method for measuring the circular equivalent diameter is not particularly limited. For example, an image of a surface of a piezoelectric material may be obtained with a polarizing microscope or a scanning electron microscope and the image may be processed to determine the circular equivalent diameter. Since the optimum magnification differs depending on the grain diameter to be analyzed, an optical microscope and an electron microscope may be properly used. The circular equivalent diameter may be determined from an image of a polished surface or a cross section instead of a surface of the material.

The relative density of the piezoelectric material may be 93% or more and 100% or less. When the relative density is less than 93%, the piezoelectric property and/or mechanical quality factor may not be sufficient and the mechanical strength may be degraded.

The method for producing the piezoelectric material of this embodiment is not particularly limited.

The piezoelectric material may be processed into a piezoelectric ceramic by a common method of sintering a mixture of solid powders containing constitutional elements, such as oxides, carbonate salts, nitrate salts, and oxalate salts, at an atmospheric pressure. Examples of the raw materials are metal compounds such as Ba compounds, Ca compounds, Ti compounds, Zr compounds, and Mn compounds.

Examples of the Ba compound that can be used include barium oxide, barium carbonate, barium oxalate, barium acetate, barium nitrate, barium titanate, barium zirconate, and barium zirconate titanate.

Examples of the Ca compound that can be used include calcium oxide, calcium carbonate, calcium oxalate, calcium acetate, calcium titanate, and calcium zirconate.

Examples of the Ti compound that can be used include titanium oxide, barium titanate, barium zirconate titanate, and calcium titanate.

Examples of the Zr compound that can be used include zirconium oxide, barium zirconate, barium zirconate titanate, and calcium zirconate.

Examples of the Mn compound that can be used include manganese carbonate, manganese oxide, manganese dioxide, manganese acetate, and trimanganese tetraoxide.

The raw materials for adjusting the molar ratio a, i.e., the molar amount of Ba and Ca in A sites to the molar amount of Ti and Zr in B sites of the piezoelectric ceramic are not particularly limited. The same effect can be achieved from a Ba compound, a Ca compound, a Ti compound, and a Zr compound.

The method for granulating raw material powders of the piezoelectric ceramic is not particularly limited. From the viewpoint of uniformity of particle diameter of the resulting powder, a spray dry method may be employed.

Examples of the binder used in granulation include polyvinyl alcohol (PVA), polyvinyl butyral (PVB), and acrylic resins. The amount of binder added is preferably 1 to 10 parts by weight and more preferably 2 to 5 parts by weight from the viewpoint of increasing the density of a compact.

The method for sintering the piezoelectric ceramic is not particularly limited. Sintering may be conducted with an electric furnace or a gas furnace or by an electric heating method, a microwave sintering method, a millimeter wave sintering method, or hot isostatic pressing (HIP). Sintering using an electric furnace or gas may be conducted in a continuous furnace or a batch furnace.

The sintering temperature of the ceramic in the sintering method described above is not particularly limited. The sintering temperature may be a temperature that allows the compounds to react and undergo sufficient crystal growth. The sintering temperature is preferably 1200° C. or more and 1550° C. or less and more preferably 1300° or more and 1480° C. or less from the viewpoint of making the grain diameter of the ceramic to be within the range of 1 μm to 10 μm. A piezoelectric ceramic sintered within this temperature range exhibits a good piezoelectric property.

In order to stabilize the properties of the piezoelectric ceramic obtained by sintering while achieving high reproducibility, the sintering temperature may be kept constant within the above described range and sintering may be conducted for 2 to 24 hours. A two-step sintering method may be employed but rapid temperature changes are not desirable from the viewpoint of productivity.

The piezoelectric ceramic may be heat-treated at a temperature of 1000° C. or higher after being polished. When a piezoelectric ceramic is mechanically polished, a residual stress occurs inside the piezoelectric ceramic. This residual stress can be relaxed by heat-treating at 1000° C. or higher and the piezoelectric property of the piezoelectric ceramic can be further improved. The heat treatment also has an effect of eliminating raw material powders, such as barium carbonate, precipitated in grain boundary portions. The amount of time for the heat treatment is not particularly limited but may be 1 hour or longer.

The piezoelectric property of the piezoelectric material of this embodiment can be evaluated by forming a piezoelectric element having a first electrode and a second electrode. Each of the first and second electrodes is constituted by an electrically conductive layer having a thickness of about 5 nm to about 2000 nm. The material used to form the electrodes may be any material commonly used in piezoelectric elements. Examples thereof include metals such as Ti, Pt, Ta, Ir, Sr, In, Sn, Au, Al, Fe, Cr, Ni, Pd, Ag, and Cu and compounds thereof.

The first and second electrodes may each be composed of one of these materials or may be constituted by a multilayer structure prepared by stacking two or more of these materials. The first and second electrodes may be composed of materials different from each other.

The method for making the first and second electrodes may be any. For example, the electrodes may be formed by baking a metal paste, by sputtering, or by vapor deposition. The first and second electrode may be patterned as desired.

The piezoelectric element may have polarization axes oriented in a particular direction. When polarization axes are oriented in a particular direction, the piezoelectric constant of the piezoelectric element is increased. The polarization method for the piezoelectric element is not particularly limited. The polarization treatment may be conducted in air or in silicone oil. The temperature during polarization may be 60° C. to 100° C. but optimum conditions slightly vary depending on the composition of the piezoelectric ceramic constituting the device. The electric field applied to conduct the polarization treatment may be 800 V/mm to 2.0 kV/mm.

The piezoelectric constant and mechanical quality factor of the piezoelectric element can be calculated from a resonant frequency and an antiresonant frequency measured with a commercially available impedance analyzer on the basis of Electronic Materials Manufacturers Association of Japan Standard (EMAS-6100). This method is hereinafter referred to as a resonance-antiresonance method.

The piezoelectric material of this embodiment is suitable for use in resonance devices (hard devices) that operate at resonance frequencies, such as piezoelectric sensors, piezoelectric transformers, and ultrasonic motors.

EXAMPLES

The present invention will now be described in further detail by way of examples below which do not limit the scope of the present invention.

Piezoelectric ceramics were prepared as follows.

Example 1

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio was 84.5:11.4:4.1 on a molar basis. In order to adjust the molar ratio a of Ba and Ca in A sites to Ti and Zr in B sites, 0.014 mol of barium oxalate was added. The resulting mixture was dry-mixed in a ball mill for 24 hours. To the resulting mixture, 0.18 parts by weight of manganese(II) acetate on a manganese metal basis and 3 parts by weight of a PVA binder relative to the mixed powder were caused to adhere to surfaces of the mixed powder by using a spray dryer in order to granulate the mixed powder.

The granulated powder was charged in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1440° C. was retained for 5 hours.

The average circular equivalent diameter and relative density of the crystal grains constituting the resultant ceramic were evaluated. The average circular equivalent diameter was 10.4 μm and the relative density was 94.6%. A polarizing microscope was mainly used to observe crystal grains. The diameter of small crystal grains was determined by using a scanning electron microscope (SEM). The average circular equivalent diameter was calculated on the basis of the observation results. The relative density was evaluated by the Archimedean method.

The ceramic was polished to a thickness of 0.5 mm and the crystal structure of the ceramic was analyzed by X-ray diffraction. As a result, only peaks attributable to a perovskite-type structure were observed.

The composition was analyzed through X-ray fluorescence analysis. The results found that 0.18 parts by weight of Mn was incorporated in a composition expressed by a chemical formula, $(Ba_{0.845}Ca_{0.155})_{1.004}(Ti_{0.959}Zr_{0.041})O_3$. This means that the composition prepared by weighing matches the composition after sintering. The contents of the elements other than Ba, Ca, Ti, Zr, and Mn were below detection limits, i.e., less than 0.1 parts by weight.

The crystal grains were observed again. However, the average circular equivalent diameter was not much different between before and after polishing.

Examples 2 to 21

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio on a molar basis was as shown in Table 1. In order to adjust the molar ratio a of Ba and Ca in A sites to Ti and Zr in B sites, barium oxalate in an amount indicated in Table 1 was added. These powders were dry-mixed in a ball mill for 24 hours. In Example 16, a total of 1.0 part by weight of Si and Cu on an oxide basis were added as auxiliary components. To the resulting mixture, manganese(II) acetate in an amount on a manganese metal basis shown in Table 1 and 3 parts by weight of a PVA binder relative to the mixed powder were caused to adhere to surfaces of the mixed powder by using a spray dryer in order to granulate the mixed powder.

The granulated powder was charged in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1350° C. to 1480° C. was retained for 5 hours. The maximum temperature was increased as the amount of Ca was increased.

The average circular equivalent diameter and the relative density of crystal grains constituting the resulting ceramic were evaluated. The results are shown in Table 2. A polarizing microscope was mainly used to observe crystal grains. The diameter of small crystal grains was determined by using a scanning electron microscope (SEM). The average circular equivalent diameter was calculated on the basis of the observation results. The relative density was evaluated by the Archimedean method.

The ceramic was polished to a thickness of 0.5 mm and the crystal structure of the ceramic was analyzed by X-ray diffraction. As a result, only peaks attributable to a perovskite-type structure were observed in all samples.

The composition was analyzed by X-ray fluorescence analysis. The results are shown in Table 3. In the table, auxiliary components refer to elements other than Ba, Ca, Ti, Zr, and Mn and 0 means that the content was below the detection limit. As a result, it was found that the composition prepared by weighing matched the composition after sintering in all samples.

The crystal grains were observed again. However, the size and conditions of the crystal grains were not much different between after sintering and after polishing.

Comparative Examples 1 to 14

The same raw material powders as those in Examples 1 to 21 and barium zirconate having an average particle diameter of 300 nm (produced by Nippon Chemical Industrial Co., Ltd.) were weighed so that the molar ratio was as shown in Table 1. Each mixture was dry-mixed in a ball mill for 24 hours. In Comparative Example 6, Y and V in a total amount of 2.1 parts by weight on an oxide basis were added as auxiliary components. To the resulting mixture, manganese (II) acetate in an amount on a manganese metal basis indicated in Table 1 and 3 parts by weight of a PVA binder relative to the mixed powder were caused to adhere to surfaces of mixed powder by using a spray dryer in order to granulate the mixed powder.

A ceramic was prepared under the same conditions as in Examples 2 to 21 by using the resulting granulated powder. The average circular equivalent diameter and the relative density of crystal grains constituting the ceramic were evaluated. The results are shown in Table 2. Evaluation of the crystal grains and the relative density was conducted as in Examples 1 to 21.

Each resulting ceramic was polished to a thickness of 0.5 mm and the crystal structure of the ceramic was analyzed by X-ray diffraction. As a result, only peaks attributable to a perovskite-type structure were observed in samples of Comparative Examples 1 to 13. In Comparative Example 14 in which Ca and Zr were not added, peaks attributable to a non-perovskite-type structure were detected although the Mn content was 0.27 parts by weight.

The composition was analyzed by X-ray fluorescence analysis. The results are shown in Table 3. As a result, it was found that the composition prepared by weighing matched the composition after sintering in all samples.

The relationship between x and y in the piezoelectric materials of Examples 1 to 21 and Comparative Examples 1 to 14 is shown in the graph of FIG. 1. In the figure, the range marked by a broken line indicates the range of x and y of general formula (1) representing the perovskite-type metal oxide described in the embodiment.

TABLE 1

|  | $BaTiO_3$ [mol] | $CaTiO_3$ [mol] | $CaZrO_3$ [mol] | $BaZrO_3$ [mol] | $BaC_2O_4$ [mol] | Mn [parts by weight] | Auxiliary components [parts by weight] |
|---|---|---|---|---|---|---|---|
| Example 1 | 84.5 | 11.4 | 4.1 | 0.0 | 0.014 | 0.18 | 0.0 |
| Example 2 | 84.5 | 8.6 | 6.9 | 0.0 | 0.014 | 0.18 | 0.0 |
| Example 3 | 81.3 | 12.7 | 6.0 | 0.0 | 0.009 | 0.12 | 0.0 |
| Example 4 | 81.3 | 12.7 | 6.0 | 0.0 | 0.017 | 0.18 | 0.0 |
| Example 5 | 81.3 | 12.7 | 6.0 | 0.0 | 0.013 | 0.18 | 0.0 |
| Example 6 | 81.3 | 12.7 | 6.0 | 0.0 | 0.021 | 0.24 | 0.0 |
| Example 7 | 81.3 | 12.7 | 6.0 | 0.0 | 0.015 | 0.24 | 0.0 |
| Example 8 | 81.3 | 12.7 | 6.0 | 0.0 | 0.023 | 0.30 | 0.0 |
| Example 9 | 80.0 | 14.5 | 5.5 | 0.0 | 0.017 | 0.22 | 0.0 |
| Example 10 | 78.0 | 15.5 | 6.5 | 0.0 | 0.014 | 0.15 | 0.0 |
| Example 11 | 78.0 | 15.5 | 6.5 | 0.0 | 0.011 | 0.15 | 0.0 |
| Example 12 | 78.0 | 15.5 | 6.5 | 0.0 | 0.018 | 0.20 | 0.0 |
| Example 13 | 78.0 | 15.5 | 6.5 | 0.0 | 0.017 | 0.20 | 0.0 |
| Example 14 | 78.0 | 15.5 | 6.5 | 0.0 | 0.018 | 0.25 | 0.0 |
| Example 15 | 74.0 | 21.5 | 4.5 | 0.0 | 0.017 | 0.24 | 0.0 |
| Example 16 | 74.0 | 19.8 | 6.2 | 0.0 | 0.017 | 0.26 | 1.0 |
| Example 17 | 70.0 | 25.9 | 4.1 | 0.0 | 0.021 | 0.26 | 0.0 |
| Example 18 | 70.0 | 25.0 | 5.0 | 0.0 | 0.020 | 0.28 | 0.0 |
| Example 19 | 70.0 | 23.1 | 6.9 | 0.0 | 0.024 | 0.30 | 0.0 |
| Example 20 | 81.3 | 12.7 | 6.0 | 0.0 | 0.029 | 0.40 | 0.0 |
| Example 21 | 84.0 | 10.1 | 5.9 | 0.0 | 0.028 | 0.40 | 0.0 |
| Comparative Example 1 | 90.5 | 5.0 | 0.0 | 4.5 | 0.005 | 0.02 | 0.0 |

TABLE 1-continued

|  | BaTiO$_3$ [mol] | CaTiO$_3$ [mol] | CaZrO$_3$ [mol] | BaZrO$_3$ [mol] | BaC$_2$O$_4$ [mol] | Mn [parts by weight] | Auxiliary components [parts by weight] |
|---|---|---|---|---|---|---|---|
| Comparative Example 2 | 84.5 | 15.5 | 0.0 | 0.0 | 0.014 | 0.15 | 0.0 |
| Comparative Example 3 | 69.5 | 15.5 | 0.0 | 15.0 | 0.014 | 0.18 | 0.0 |
| Comparative Example 4 | 68.0 | 25.5 | 6.5 | 0.0 | 0.011 | 0.15 | 0.0 |
| Comparative Example 5 | 81.3 | 12.7 | 6.0 | 0.0 | 0.000 | 0.18 | 0.0 |
| Comparative Example 6 | 78.0 | 15.5 | 6.5 | 0.0 | 0.014 | 0.15 | 2.1 |
| Comparative Example 7 | 81.3 | 12.7 | 6.0 | 0.0 | 0.040 | 0.18 | 0.0 |
| Comparative Example 8 | 86.0 | 6.5 | 7.5 | 0.0 | 0.005 | 0.00 | 0.0 |
| Comparative Example 9 | 81.3 | 12.7 | 6.0 | 0.0 | 0.029 | 0.45 | 0.0 |
| Comparative Example 10 | 78.0 | 15.5 | 6.5 | 0.0 | 0.014 | 0.15 | 0.0 |
| Comparative Example 11 | 78.0 | 15.5 | 6.5 | 0.0 | 0.014 | 0.15 | 0.0 |
| Comparative Example 12 | 78.0 | 15.5 | 6.5 | 0.0 | 0.014 | 0.15 | 0.0 |
| Comparative Example 13 | 100.0 | 0.0 | 0.0 | 0.0 | 0.008 | 0.12 | 0.0 |
| Comparative Example 14 | 94.0 | 0.0 | 0.0 | 6.0 | 0.014 | 0.27 | 0.0 |

TABLE 2

|  | Average circular equivalent diameter [μm] | Relative density [%] |
|---|---|---|
| Example 1 | 10.4 | 94.6 |
| Example 2 | 5.7 | 94.8 |
| Example 3 | 6.7 | 94.2 |
| Example 4 | 8.8 | 95.1 |
| Example 5 | 5.5 | 97.5 |
| Example 6 | 3.1 | 95.6 |
| Example 7 | 3.2 | 97.1 |
| Example 8 | 4.2 | 98.0 |
| Example 9 | 5.6 | 98.7 |
| Example 10 | 4.0 | 94.9 |
| Example 11 | 3.9 | 96.0 |
| Example 12 | 5.2 | 96.2 |
| Example 13 | 6.3 | 97.1 |
| Example 14 | 4.9 | 97.4 |
| Example 15 | 6.1 | 96.2 |
| Example 16 | 6.5 | 92.1 |
| Example 17 | 2.1 | 95.7 |
| Example 18 | 3.9 | 96.6 |
| Example 19 | 4.6 | 96.5 |
| Example 20 | 8.1 | 98.5 |
| Example 21 | 7.4 | 98.8 |
| Comparative Example 1 | 6.1 | 93.2 |
| Comparative Example 2 | 2.3 | 93.6 |
| Comparative Example 3 | 7.8 | 93.8 |
| Comparative Example 4 | 0.7 | 93.1 |
| Comparative Example 5 | 32.2 | 96.1 |
| Comparative Example 6 | 1.8 | 96.1 |
| Comparative Example 7 | 0.5 | 93.8 |
| Comparative Example 8 | 7.9 | 93.0 |
| Comparative Example 9 | 1.2 | 93.1 |
| Comparative Example 10 | 0.8 | 94.2 |
| Comparative Example 11 | 182.0 | 97.6 |
| Comparative Example 12 | 9.1 | 89.0 |
| Comparative Example 13 | 6.4 | 98.1 |
| Comparative Example 14 | 7.1 | 96.0 |

TABLE 3

|  | x | y | a | Mn [parts by weight] | Auxiliary components [parts by weight] | b |
|---|---|---|---|---|---|---|
| Example 1 | 0.155 | 0.041 | 1.004 | 0.18 | 0.0 | 3.78 |
| Example 2 | 0.155 | 0.069 | 1.004 | 0.18 | 0.0 | 2.25 |
| Example 3 | 0.187 | 0.060 | 1.001 | 0.12 | 0.0 | 3.12 |
| Example 4 | 0.187 | 0.060 | 1.007 | 0.18 | 0.0 | 3.12 |
| Example 5 | 0.187 | 0.060 | 1.003 | 0.18 | 0.0 | 3.12 |
| Example 6 | 0.187 | 0.060 | 1.009 | 0.24 | 0.0 | 3.12 |
| Example 7 | 0.187 | 0.060 | 1.003 | 0.24 | 0.0 | 3.12 |
| Example 8 | 0.187 | 0.060 | 1.008 | 0.30 | 0.0 | 3.12 |
| Example 9 | 0.200 | 0.055 | 1.005 | 0.22 | 0.0 | 3.64 |
| Example 10 | 0.220 | 0.065 | 1.005 | 0.15 | 0.0 | 3.38 |
| Example 11 | 0.220 | 0.065 | 1.002 | 0.15 | 0.0 | 3.38 |
| Example 12 | 0.220 | 0.065 | 1.007 | 0.20 | 0.0 | 3.38 |
| Example 13 | 0.220 | 0.065 | 1.006 | 0.20 | 0.0 | 3.38 |
| Example 14 | 0.220 | 0.065 | 1.005 | 0.25 | 0.0 | 3.38 |
| Example 15 | 0.260 | 0.045 | 1.004 | 0.24 | 0.0 | 5.78 |
| Example 16 | 0.260 | 0.062 | 1.004 | 0.26 | 1.0 | 4.19 |
| Example 17 | 0.300 | 0.041 | 1.007 | 0.26 | 0.0 | 7.32 |
| Example 18 | 0.300 | 0.050 | 1.006 | 0.28 | 0.0 | 6.00 |
| Example 19 | 0.300 | 0.069 | 1.009 | 0.30 | 0.0 | 4.35 |
| Example 20 | 0.187 | 0.060 | 1.010 | 0.40 | 0.0 | 3.12 |
| Example 21 | 0.160 | 0.059 | 1.009 | 0.40 | 0.0 | 2.71 |
| Comparative Example 1 | 0.050 | 0.095 | 1.002 | 0.02 | 0.0 | 0.53 |
| Comparative Example 2 | 0.155 | 0.000 | 1.005 | 0.15 | 0.0 | — |
| Comparative Example 3 | 0.155 | 0.150 | 1.004 | 0.18 | 0.0 | 1.03 |
| Comparative Example 4 | 0.320 | 0.065 | 1.002 | 0.15 | 0.0 | 4.92 |
| Comparative Example 5 | 0.187 | 0.060 | 0.980 | 0.18 | 0.0 | 3.12 |
| Comparative Example 6 | 0.220 | 0.065 | 1.005 | 0.15 | 2.1 | 3.38 |
| Comparative Example 7 | 0.187 | 0.060 | 1.030 | 0.18 | 0.0 | 3.12 |
| Comparative Example 8 | 0.140 | 0.075 | 1.003 | 0.00 | 0.0 | 1.87 |
| Comparative Example 9 | 0.187 | 0.060 | 1.008 | 0.45 | 0.0 | 3.12 |
| Comparative Example 10 | 0.220 | 0.065 | 1.005 | 0.15 | 0.0 | 3.38 |
| Comparative Example 11 | 0.220 | 0.065 | 1.005 | 0.15 | 0.0 | 3.38 |
| Comparative Example 12 | 0.220 | 0.065 | 1.005 | 0.15 | 0.0 | 3.38 |
| Comparative Example 13 | 0.000 | 0.000 | 1.001 | 0.12 | 0.0 | — |
| Comparative Example 14 | 0.000 | 0.060 | 1.001 | 0.27 | 0.0 | 0.00 |

Preparation of Piezoelectric Element and Evaluation of Static Characteristics

Examples 1 to 21

Piezoelectric elements were prepared as follows by using ceramics of Examples 1 to 21.

A gold electrode having a thickness of 400 nm was formed on both sides of the disk-shaped ceramic described above by DC sputtering. A titanium film functioning as an adhesive layer and having a thickness of 30 nm was formed between the electrode and the ceramic. The ceramic with the electrodes was cut into a strip-shaped piezoelectric element 10 mm×2.5 mm×0.5 mm in size.

The piezoelectric element was placed on a hot plate having a surface adjusted to 60° C. to 100° C. and a 1 kV/mm electric field was applied to the piezoelectric element for 30 minutes to conduct a polarization treatment.

The static characteristics, i.e., the Curie temperature, the piezoelectric constant $d_{31}$, and the mechanical quality factor (Qm), of the polarized piezoelectric elements that include piezoelectric materials of Examples and Comparative Examples were evaluated. The results are shown in Table 4. In the table, the column "Phase transition point" indicates the results of investigating whether a crystal structure phase transition point is present in a range of −25° C. to 100° C. Samples from which a maximal point was detected in measuring the dielectric constant by using a minute AC field having a frequency of 1 kHz while varying the temperature in the range of −25° C. to 100° C. are marked as "Present" and samples from which no maximal point was detected are marked as "Absent". The Curie temperature was determined from the temperature at which the dielectric constant measured by using a minute AC field having a frequency of 1 kHz while varying the temperature was maximal. The piezoelectric constant $d_{31}$ was determined by a resonance-antiresonance method and the absolute values are indicated in the table.

The ratio of the total amount of Ba and Ca to the total amount of Ti, Zr, and Mn is also indicated in Table 4. In the table, "X" indicates that evaluation could not be conducted.

TABLE 4

|  | Phase transition point | Curie temperature [° C.] | Piezoelectric constant $\|d_{31}\|$ [pC/N] | Mechanical quality factor | (Ba + Ca)/ (Ti + Zr + Mn) |
|---|---|---|---|---|---|
| Example 1 | Absent | 117 | 82 | 1050 | 0.997 |
| Example 2 | Absent | 102 | 88 | 820 | 0.997 |
| Example 3 | Absent | 106 | 85 | 480 | 0.996 |
| Example 4 | Absent | 106 | 79 | 800 | 1.000 |
| Example 5 | Absent | 106 | 85 | 1120 | 0.996 |
| Example 6 | Absent | 106 | 77 | 1100 | 0.999 |
| Example 7 | Absent | 106 | 81 | 1400 | 0.993 |
| Example 8 | Absent | 106 | 75 | 1450 | 0.996 |
| Example 9 | Absent | 112 | 80 | 1200 | 0.996 |
| Example 10 | Absent | 105 | 77 | 640 | 0.999 |
| Example 11 | Absent | 105 | 81 | 950 | 0.996 |
| Example 12 | Absent | 105 | 75 | 860 | 0.999 |
| Example 13 | Absent | 106 | 77 | 1110 | 0.998 |
| Example 14 | Absent | 105 | 73 | 1280 | 0.995 |
| Example 15 | Absent | 115 | 70 | 1250 | 0.995 |
| Example 16 | Absent | 106 | 74 | 1230 | 0.994 |
| Example 17 | Absent | 118 | 58 | 1340 | 0.997 |
| Example 18 | Absent | 116 | 61 | 1370 | 0.995 |
| Example 19 | Absent | 100 | 68 | 1240 | 0.998 |
| Example 20 | Absent | 106 | 66 | 1460 | 0.993 |
| Example 21 | Absent | 108 | 81 | 1400 | 0.993 |
| Comparative Example 1 | Present | 88 | 130 | 190 | 0.999 |
| Comparative Example 2 | Absent | 130 | 38 | 830 | 0.999 |
| Comparative Example 3 | Present | 60 | 135 | 720 | 0.997 |
| Comparative Example 4 | Absent | 106 | 21 | 710 | 0.996 |
| Comparative Example 5 | Absent | 110 | X | X | 0.973 |
| Comparative Example 6 | Absent | 106 | 36 | 530 | 0.999 |
| Comparative Example 7 | Absent | 110 | 20 | 810 | 1.023 |
| Comparative Example 8 | Absent | 95 | 130 | 120 | 1.003 |
| Comparative Example 9 | Absent | 110 | 33 | 1480 | 0.990 |
| Comparative Example 10 | Absent | 106 | 41 | 900 | 0.999 |
| Comparative Example 11 | Absent | 106 | X | X | 0.999 |
| Comparative Example 12 | Absent | 106 | 32 | 630 | 0.999 |
| Comparative Example 13 | Present | 130 | 115 | 1350 | 0.996 |
| Comparative Example 14 | Absent | 100 | X | X | 0.989 |

Comparison was made between Examples 4 and 5, between Examples 6 and 7, between Examples 10 and 11, and between Examples 12 and 13. In each combination, x, y, and the Mn content were the same. However, Examples 5, 7, 11, and 13 in which a was small exhibited superior piezoelectric constants and mechanical quality factors. In Examples 5, 7, 11, and 13, the ratio of the total amount of Ba and Ca to the total amount of Ti, Zr, and Mn was 0.993 or more and 0.998 or less.

Similar characteristics were observed in all Examples when the gold electrodes were replaced by electrodes prepared by baking a silver paste.

Comparative Examples 1 to 14

Piezoelectric elements were prepared by using ceramics of Comparative Examples 1 to 14. Preparation and evaluation of the devices were conducted as in Examples 1 to 21.

In Comparative Example 2 in which Zr was not added, the piezoelectric constant $d_{31}$ was low, i.e., 41 [pC/N]. In Comparative Example 3 in which the Zr content was as high as 15% (y=0.150), the Curie temperature was low, i.e., 60° C., and the temperature range in which the piezoelectric element is operable was narrow. In Comparative Example 4 in which the Ca content was as high as 32% (x=0.32), sintering did not proceed sufficiently and grain growth was insufficient, resulting in a low piezoelectric constant. In Comparative Example 5, a was small, i.e., 0.980, and thus abnormal grain growth, i.e., growth of grains larger than 30 μm, occurred and the static characteristics other than the Curie temperature could not be evaluated. The average circular equivalent diameter of crystal grains constituting a piezoelectric material used in the sample of Comparative Example 5 was significantly larger than the thickness (0.5 mm=500 μm) of the strip-shaped piezoelectric element, and thus the piezoelectric material cleaved easily and did not have a mechanical strength sufficient for use in a device. In Comparative Example 6, a total of 2.1 parts by weight of Y and V were contained as the auxiliary components and thus the piezoelectric constant was small. In Comparative Example 7, the value of a was as large as 1.030 and grain growth was insufficient due to insufficient sintering, resulting in a low piezoelectric constant $d_{31}$, i.e., 20 [pC/N]. In Comparative Example 9, the Mn content was as high as 0.45 parts by weight and thus the piezoelectric constant was small. In Comparative Example 10, the average circular equivalent diameter was smaller than 1 μm and thus the piezoelectric constant was small. In Comparative Example 11, abnormal growth of grains growing to larger than 100 μm in terms of average circular equivalent diameter was observed and thus the static characteristics other than the Curie temperature could not be evaluated as with the sample of Comparative Example 5. In Comparative Example 12, the piezoelectric constant was small since the relative density was lower than 93%. In Comparative Example 14, peaks attributable to a non-perovskite-type structure were detected and thus the static characteristics other than the Curie temperature could not be evaluated. The static characteristics of Comparative Examples 1, 8, and 13 were comparable to those of samples of Examples.

Evaluation of Dynamic Characteristics of Piezoelectric Element

Dynamic characteristics of the piezoelectric elements that include piezoelectric materials corresponding to those of Examples and Comparative Examples were evaluated as below. The dynamic characteristics measured were the rate of change in piezoelectric constant and the power consumption observed when voltage was applied under the conditions described below.

For Examples 1 to 21 and Comparative Examples 1, 8, and 13, a resonance-antiresonance method was used to evaluate the mechanical quality factor. The results are shown in Table 5.

An AC voltage having a frequency near the resonant frequency (190 kHz to 230 kHz) was applied to the strip-shaped piezoelectric element and the relationship between the vibration speed and the power consumption of the device was evaluated. The vibration speed was measured with a Doppler vibrometer and the power consumption was measured with a power meter. The power consumption observed when the applied voltage and frequency were changed so that the vibration speed was 0.40 m/s is indicated in Table 5.

TABLE 5

| | Mechanical quality factor Qm | (Ba + Ca)/(Ti + Zr + Mn) | Power consumption [mW] |
|---|---|---|---|
| Example 1 | 1050 | 0.997 | 10 |
| Example 2 | 1080 | 0.997 | 10 |
| Example 3 | 480 | 0.996 | 19 |
| Example 4 | 800 | 1.000 | 11 |
| Example 5 | 1120 | 0.996 | 9 |
| Example 6 | 1100 | 0.999 | 8 |
| Example 7 | 1400 | 0.995 | 7 |
| Example 8 | 1450 | 0.996 | 7 |
| Example 9 | 1200 | 0.996 | 9 |
| Example 10 | 640 | 0.999 | 16 |
| Example 11 | 950 | 0.996 | 10 |
| Example 12 | 860 | 0.999 | 13 |
| Example 13 | 1110 | 0.995 | 9 |
| Example 14 | 1280 | 0.995 | 9 |
| Example 15 | 1250 | 0.995 | 9 |
| Example 16 | 1230 | 0.994 | 9 |
| Example 17 | 1340 | 0.997 | 8 |
| Example 18 | 1370 | 0.995 | 8 |
| Example 19 | 1240 | 0.998 | 9 |
| Example 20 | 1460 | 0.993 | 6 |
| Example 21 | 1400 | 0.993 | 6 |
| Comparative Example 1 | 190 | 1.000 | 54 |
| Comparative Example 8 | 120 | 1.003 | 65 |
| Comparative Example 13 | 1350 | 0.996 | 11 |

The power consumption of all samples of Examples and Comparative Example 13 was 20 mW or less whereas the power consumption of samples of Comparative Examples 1 and 8 was more than 50 mW. This is presumably attributable to the fact that the mechanical quality factor was low, i.e., 190 or less, in Comparative Examples 1 and 8. The mechanical quality factor is important in operating the device near the resonance frequency and is desirably 400 or higher.

Evaluation of Durability of Piezoelectric Element

The durability of piezoelectric elements was tested through a cycle test by placing samples of Examples 1 to 21 and Comparative Examples 1 and 13 in a thermostat and repeating a cycle of 25° C.→−20° C.→50° C.→25° C. for 100 cycles. The piezoelectric constant $d_{31}$ before and after the cycle test was evaluated and the rate of change in piezoelectric constant was summarized in Table 6.

TABLE 6

| | Phase transition point | Piezoelectric constant $|d_{31}|$ before cycle test [pC/N] | Piezoelectric constant $|d_{31}|$ after cycle test [pC/N] | Rate of change |
|---|---|---|---|---|
| Example 1 | Absent | 82 | 79 | −3.7% |
| Example 2 | Absent | 88 | 84 | −4.5% |
| Example 3 | Absent | 85 | 81 | −4.7% |
| Example 4 | Absent | 79 | 76 | −3.8% |
| Example 5 | Absent | 85 | 82 | −3.5% |
| Example 6 | Absent | 77 | 75 | −2.6% |
| Example 7 | Absent | 81 | 78 | −3.7% |
| Example 8 | Absent | 75 | 72 | −4.0% |
| Example 9 | Absent | 80 | 77 | −3.8% |
| Example 10 | Absent | 77 | 74 | −3.9% |
| Example 11 | Absent | 81 | 78 | −3.7% |
| Example 12 | Absent | 75 | 71 | −5.3% |
| Example 13 | Absent | 77 | 75 | −2.6% |
| Example 14 | Absent | 73 | 70 | −4.1% |
| Example 15 | Absent | 70 | 68 | −2.9% |
| Example 16 | Absent | 74 | 71 | −4.1% |
| Example 17 | Absent | 58 | 56 | −3.4% |
| Example 18 | Absent | 61 | 58 | −4.9% |
| Example 19 | Absent | 68 | 66 | −2.9% |
| Example 20 | Absent | 66 | 64 | −3.0% |
| Example 21 | Absent | 81 | 79 | −2.5% |
| Comparative Example 1 | Present | 130 | 112 | −13.8% |
| Comparative Example 13 | Present | 115 | 101 | −12.2% |

Whereas the rate of change in piezoelectric property was 5% or less in all samples of Examples, a change of 10% or more occurred in all samples of Comparative Examples. None of the samples of Examples had a crystal structure phase transition point in the range of −25° C. to 100° C. This is presumably the reason why the deterioration of polarization was less against changes in temperature ranging from −25° C. to 50° C. In contrast, the crystal structure phase transition point in Examples 1 and 13 lied in the range of −25° C. to 50° C. and thus the polarization was significantly degraded as the device transitioned back and forth between the crystal structure phase transition points, possibly resulting in a decrease in piezoelectric property. In other words, a piezoelectric ceramic having a crystal structure phase transition temperature in the range of −25° C. to 100° C. does not provide a device with sufficient durability.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-149359, filed Jul. 5, 2011, which is hereby incorporated by reference herein in its entirety.

INDUSTRIAL APPLICABILITY

A piezoelectric material according to the invention has stable, excellent piezoelectric constant and mechanical quality factor in a wide operating temperature range, has low impact on the environment, and can be used in appliances, such as ultrasonic motors, that use a large number of piezoelectric elements containing piezoelectric materials.

The invention claimed is:

1. A piezoelectric material comprising:

a perovskite-type metal oxide represented by general formula (1) as a main component $$(Ba_{1-x}Ca_x)_a(Ti_{1-y}Zr_y)O_3 \text{ (where } 1.00 \leq a \leq 1.01, 0.155 \leq x \leq 0.300, 0.041 \leq y \leq 0.069) \quad (1) \text{ and}$$

a manganese component, wherein a manganese content relative to 100 parts by weight of the perovskite-type metal oxide is 0.12 parts by weight or more and 0.40 parts by weight or less on a metal basis, wherein an auxiliary component content other than manganese relative to 100 parts by weight of the perovskite-type metal oxide is less than 1.2 parts by weight on an oxide basis, wherein the piezoelectric material is constituted by crystal grains having an average circular equivalent diameter of more than 1 μm and less than 10.4 μm, and wherein the piezoelectric material has a relative density of more than 92.1% and 100% or less.

2. The piezoelectric material according to claim 1, wherein a molar ratio b of Ca to Zr in the piezoelectric material is 2.65≤b≤5.00.

3. The piezoelectric material according to claim 1, wherein the piezoelectric material does not have a crystal structure phase transition point in a range of −25° C. to 100° C.

* * * * *